United States Patent
Caroff et al.

(10) Patent No.: US 9,599,522 B2
(45) Date of Patent: Mar. 21, 2017

(54) DEVICE FOR MEASURING OR EVALUATING A CHARACTERISTIC OF A HEAT FLUX EXCHANGED BETWEEN A FIRST MEDIUM AND A SECOND MEDIUM

(75) Inventors: Tristan Caroff, Gieres (FR); Natalio Mingo Bisquert, Sassenage (FR); Vincent Remondiere, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 700 days.

(21) Appl. No.: 13/980,953

(22) PCT Filed: Jan. 20, 2012

(86) PCT No.: PCT/EP2012/050866
§ 371 (c)(1),
(2), (4) Date: Sep. 26, 2013

(87) PCT Pub. No.: WO2012/098228
PCT Pub. Date: Jul. 26, 2012

(65) Prior Publication Data
US 2014/0036951 A1    Feb. 6, 2014

(30) Foreign Application Priority Data
Jan. 21, 2011 (FR) .................................. 11 50481

(51) Int. Cl.
*G01K 17/00* (2006.01)
*G01K 7/00* (2006.01)
(Continued)

(52) U.S. Cl.
CPC ............... *G01K 17/00* (2013.01); *G01K 7/02* (2013.01); *G01K 17/20* (2013.01); *H01L 35/32* (2013.01); *H01L 35/34* (2013.01)

(58) Field of Classification Search
USPC ............................................ 374/29, 179, 31
See application file for complete search history.

(56) References Cited

U.S. PATENT DOCUMENTS

| 3,296,034 A | 1/1967 | Reich |
| 3,382,714 A * | 5/1968 | Miller .................... G01K 17/00 374/29 |

(Continued)

FOREIGN PATENT DOCUMENTS

| FR | 2 942 037 A | 8/2010 |
| GB | 2 218 261 A | 11/1989 |

(Continued)

OTHER PUBLICATIONS

Koestoer, Raldi Artono, "Zero Method Heat Flux Sensor", *Sensors and Actuators*, 7 (1985), pp. 145-151.

*Primary Examiner* — Mirellys Jagan
(74) *Attorney, Agent, or Firm* — Frommer Lawrence & Haug LLP

(57) ABSTRACT

Disclosed is a method for forecasting the energy consumption of a building, taking into account the heat exchanges from received solar radiation and/or heat convection and/or conduction between the building and the outside environment based on a physical model. The method includes a learning step to deduce the value of the parameters of the physical model based on previous measurements performed on the building.

21 Claims, 8 Drawing Sheets

(51) Int. Cl.
*G01K 7/02* (2006.01)
*G01K 17/20* (2006.01)
*H01L 35/32* (2006.01)
*H01L 35/34* (2006.01)

(56) References Cited

U.S. PATENT DOCUMENTS

| | | | | |
|---|---|---|---|---|
| 3,607,445 A | * | 9/1971 | Hines | G01K 7/02 |
| | | | | 136/225 |
| 3,712,131 A | * | 1/1973 | Smith | G01K 17/00 |
| | | | | 374/29 |
| 4,779,994 A | * | 10/1988 | Diller | H01L 35/08 |
| | | | | 136/225 |
| 5,288,147 A | | 2/1994 | Schaefer et al. | |
| 7,077,563 B2 | | 7/2006 | Xiao et al. | |
| 7,131,768 B2 | * | 11/2006 | Habboosh | H01L 35/20 |
| | | | | 136/200 |
| 2006/0034346 A1 | * | 2/2006 | Saio | G01K 7/00 |
| | | | | 374/185 |
| 2008/0245398 A1 | * | 10/2008 | Bell | F02G 1/043 |
| | | | | 136/224 |
| 2013/0215927 A1 | * | 8/2013 | Camberlein | G01J 5/0225 |
| | | | | 374/29 |
| 2013/0223473 A1 | * | 8/2013 | Kim | G01K 17/00 |
| | | | | 374/29 |
| 2014/0286373 A1 | * | 9/2014 | Thresher | G01N 25/18 |
| | | | | 374/29 |
| 2015/0219574 A1 | * | 8/2015 | Yao | G01N 25/482 |
| | | | | 374/1 |
| 2015/0247418 A1 | * | 9/2015 | Kulkarni | F01D 21/003 |
| | | | | 374/30 |

FOREIGN PATENT DOCUMENTS

| | | |
|---|---|---|
| WO | WO 99/19702 A | 4/1999 |
| WO | WO 2008/024455 A | 2/2008 |

* cited by examiner

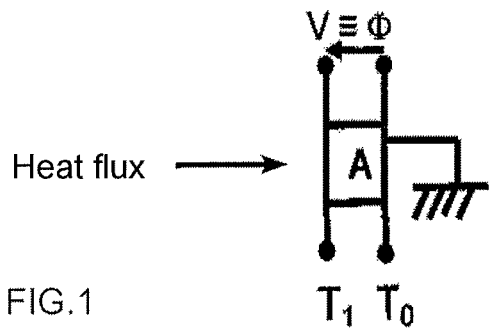
FIG.1
RELATED ART
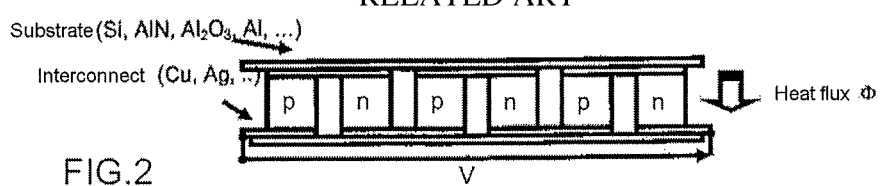
FIG.2
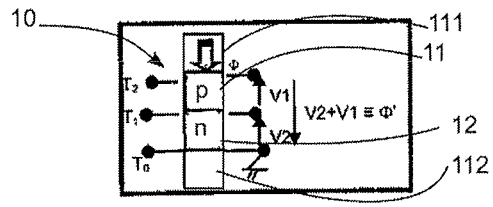
FIG.3
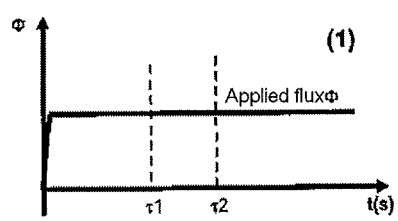
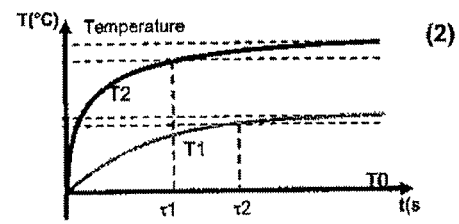
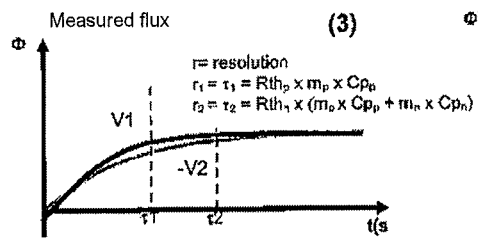
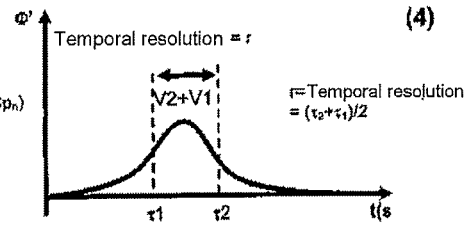

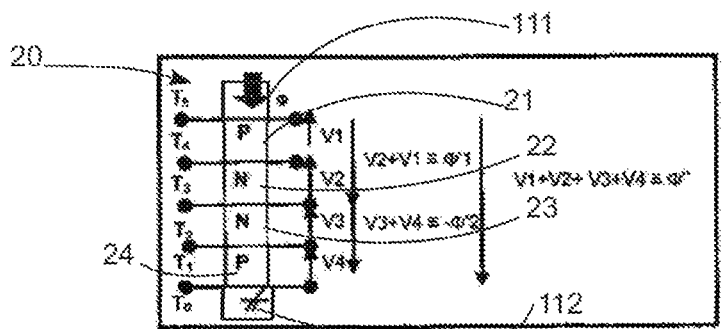
FIG.4
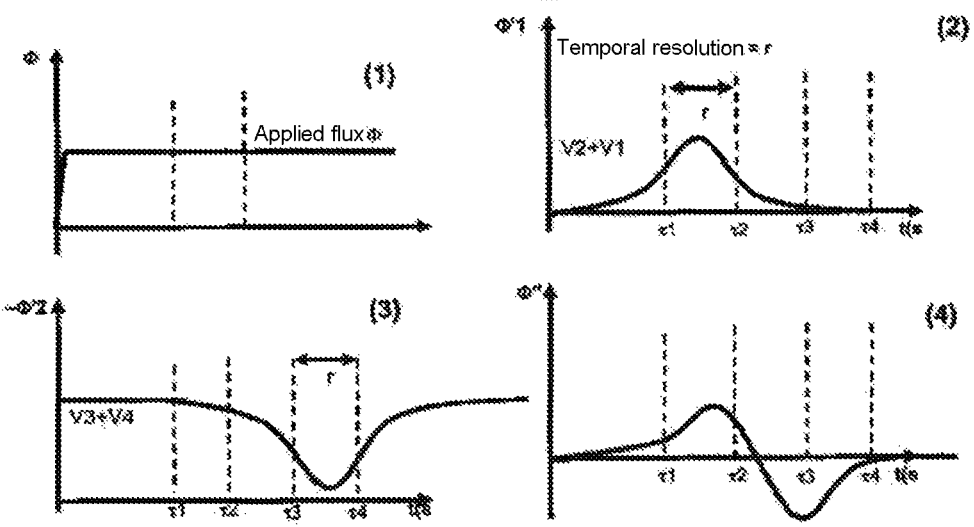
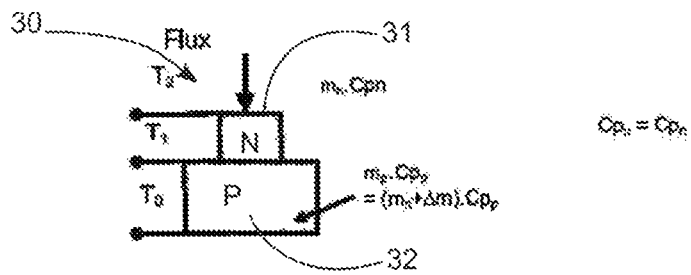
FIG.5
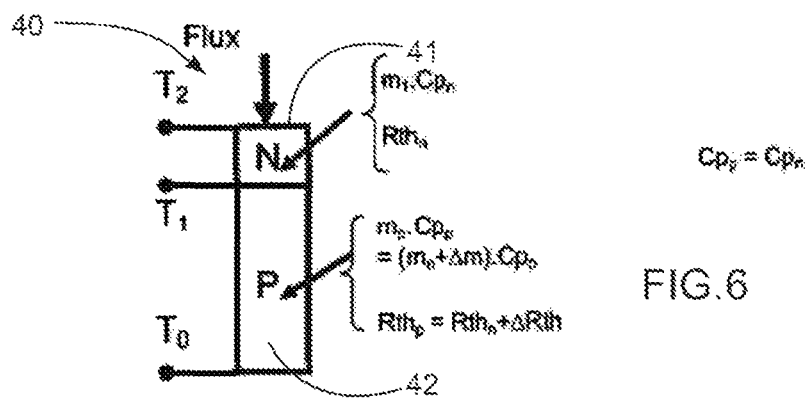
FIG.6

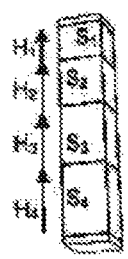
FIG.10
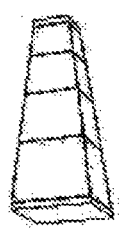 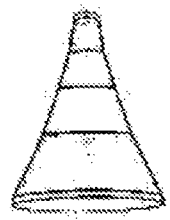
FIG.11
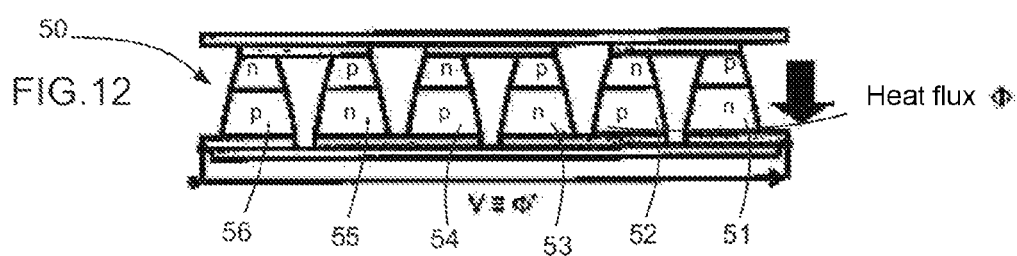
FIG.12
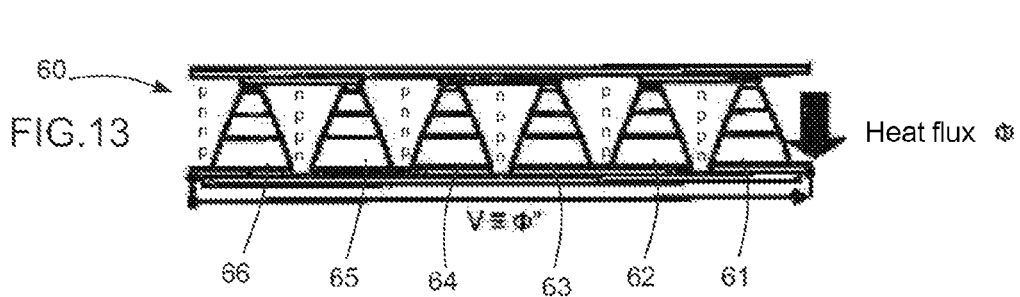
FIG.13

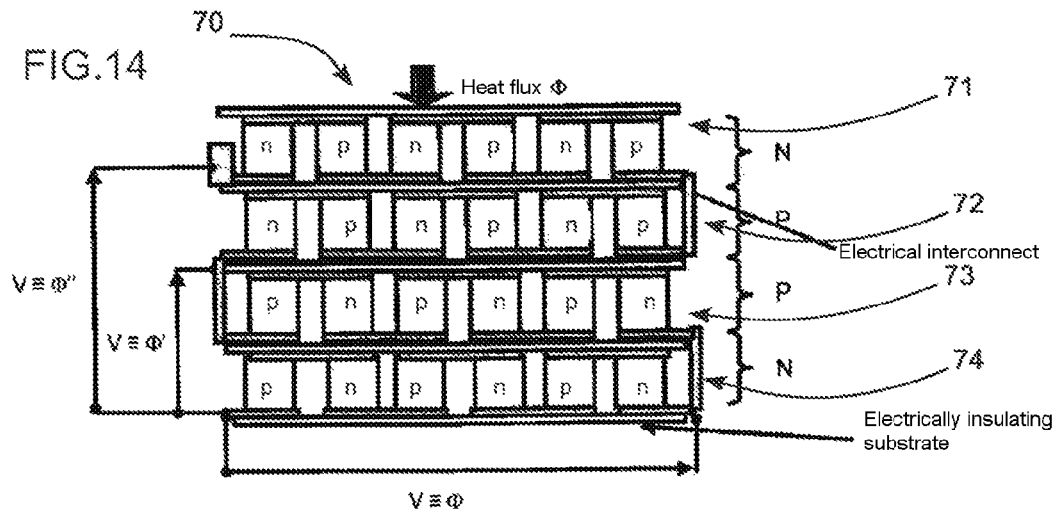
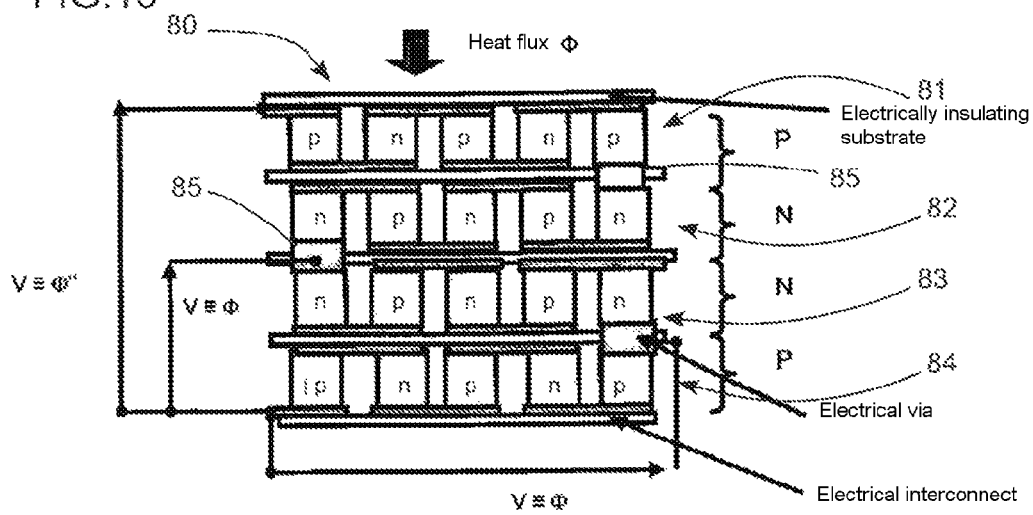

DEVICE FOR MEASURING OR EVALUATING A CHARACTERISTIC OF A HEAT FLUX EXCHANGED BETWEEN A FIRST MEDIUM AND A SECOND MEDIUM

This application is a 371 of PCT/EP2012/050866 filed on Jan. 20, 2012, published on Jul. 26, 2012 under publication number WO 2012/098228, which claims priority benefits from French Patent Application Number 1150481 filed Jan. 21, 2011, the disclosure of which is incorporated herein by reference.

BACKGROUND

1. Field of the Disclosure

The present invention relates to the technical field of the measurement and evaluation of a characteristic of a heat flux transmitted from a first medium to a second medium or exchanged between a first medium and a second medium. The invention also relates to a method for measuring or evaluating a characteristic of a heat flux transmitted from the first medium to the second medium.

The invention especially relates to systems for measuring and regulating heat flux.

2. Related Art

Measurement of heat flux allows heat loss or gain from an object (for example an oven, a building, etc.) to be quantified. Currently, no sensor allows the variation in amount of heat passing through an object and the variation in its temperature to be predicted in real-time. Such predictive devices would be suitable for systems for the thermal regulation of buildings, for detecting the outbreak of fires, for detecting physical effects (phase changes and material growth, especially crystallization) and also for thermal management of integrated electronic systems.

Thermoelectric converters exist allowing thermal energy to be converted into electrical power by virtue of the "Seebeck" effect, illustrated in FIG. 1. With such a converter, the heat flux $\phi$ transferred from a medium the temperature of which is $T_0$ to a medium the temperature of which is $T_1$, can be evaluated. Specifically, by virtue of the Seebeck effect a potential difference V appears across a thermoelectric material A of the converter, the ends of which are subjected to a thermal gradient $T_1-T_0$. Operation of such a converter respects the following relationship:

$$V = S_A \times (T_1 - T_0) = S_A Rth_A \times \phi$$

where
$Rth_A$ is the thermal resistance of the thermoelectric material A, and
$S_A$ is the Seebeck coefficient of the thermoelectric material A.

Specifically, the principle of the Seebeck effect is as follows: if a heat flux $\phi$ passes through a conductive or semiconductor material causing, on account of the thermal resistance $Rth_A$ of the material, a temperature gradient $\Delta T = T_1 - T_0$ (where $T_1 > T_0$) to form between its ends, a potential difference V then forms between the ends of the conductor.

Thermoelectric n-type semiconductors produce an electrical voltage proportional to the negative of the heat flux passing through them and thermoelectric p-type semiconductors produce an electrical voltage proportional to the heat flux passing through them.

Thermoelectric converters and thermoelectric fluxmeters mainly consist of a series of a number (N) of pairs of elements made of thermoelectric materials with different Seebeck coefficients, preferably alternately n-doped (or doped n-type) or p-doped (or doped p-type), the elements being electrically connected in series and thermally connected in parallel, as shown in FIG. 2. These elements are for example placed intermediate between two substrates, for example substrates made of Si, AlN, $Al_2O_3$, Al, etc. Moreover, the elements are electrically connected to one another for example by virtue of metal connection elements, such as connection elements made of copper or silver.

During passage of a heat flux $\phi$, the thermoelectric converter or fluxmeter delivers a voltage proportional to this flux:

$$V = N(S_p - S_n) \times \Delta T = N \times S_{pn} \times \Delta T = N \times S_{pn} \times \phi \times Rth$$

where:
$S_{pn}$ is the differential Seebeck coefficient between the p-type (p) and n-type (n) elements; and
Rth is the thermal resistance of the module composed of N thermoelectric p-n pairs thermally connected in parallel.

A fluxmeter therefore allows the amount of heat exchanged between two objects or two media to be quantified. This measurement is proportional to the geometrical or spatial temperature gradient between the ends of the fluxmeter ($\Delta T = dT/dx = T_{hot} - T_{cold}$), but is not related to the variation of the temperature over time (dT/dt), and therefore does not allow the variation in the temperature of an object through which a heat flux flows to be predicted. The only way that this can be achieved is to develop a sensor or converter that allows a signal proportional to the derivative of the heat flux to be delivered directly.

Generally, devices for measuring flux provide no predictive information on the variation of the temperature of the system, but only on the amount of energy that penetrates into an object. Fluxmeters are sensors or transducers that only allow a spatial temperature difference to be measured.

No known document relating to fluxmeters considers measurement of flux derivatives (or measurement of variation in flux over time) by means of a sensor.

Documents WO 2008/024455, U.S. Pat. No. 5,288,147 and WO 1999/019702 disclose calorimetric systems that employ differential measurements between thermocouples; however these devices only allow a temperature difference between two samples placed in two separate regions to be measured and do not allow the time derivative of the heat flux to be quantified.

U.S. Pat. No. 7,077,563 describes a device allowing a small but abrupt thermal variation linked to the start of growth of a thin film, and based on a differential measurement of two flux in two different positions, to be observed. This device, based on the subtraction of two simultaneous flux measurements allows the variation in heat flux to be observed, but in no way allows the time derivative (variation) of the heat flux to be measured and the variation in the temperature of the system to be predicted.

The aim of the invention is to provide a device for measuring or evaluating a heat flux characteristic allowing the aforementioned problems to be solved and improving known prior-art devices. In particular, the invention provides an evaluating or measuring device allowing a time derivative of a value of the magnitude of a heat flux to be measured or evaluated in real-time.

BRIEF SUMMARY

The device according to the invention makes it possible to measure or evaluate a characteristic of a heat flux exchanged between a first medium and a second medium, especially a time derivative of the heat flux. The device comprises a first thermoelectric means and a second thermoelectric means. The first and second thermoelectric means are electrically connected in series and thermally connected in series. The first thermoelectric means is of a first nature (n-type) and the second thermoelectric means is of a second nature (p-type), the first and second natures being such that the first thermoelectric means and the second thermoelectric means polarize with opposite polarities under the effect of a heat flux having a given direction and a given sign. Thus, opposite electrical potential differences are created between the ends of the thermoelectric means. The nature of the means is defined by the polarity of the polarization when a given heat flux flows through the means.

The product of the heat capacity of the second thermoelectric means and the thermal resistance of the second thermoelectric means may be greater than the product of the heat capacity of the first thermoelectric means and the thermal resistance of the first thermoelectric means.

The cross-sectional area of the device, perpendicular to the heat flux, may be constant.

The thermal resistance of the second thermoelectric means may be higher than the thermal resistance of the first thermoelectric means.

The height of the second thermoelectric means may be greater than the height of the first thermoelectric means and the thermal resistivity of the second thermoelectric means may be at least substantially equal to the thermal resistivity of the first thermoelectric means.

The cross-sectional area of the device perpendicular to the heat flux may not be constant.

The cross-sectional area of the second thermoelectric means perpendicular to the heat flux may be larger than the cross-sectional area of the first thermoelectric means perpendicular to the heat flux.

The cross-sectional area of the second thermoelectric means perpendicular to the heat flux may be continuously variable.

The thermal resistance of the second thermoelectric means may be higher than or equal to the thermal resistance of the first thermoelectric means.

The product of the thermal resistance and the Seebeck coefficient of the second thermoelectric means may be equal to the product of the thermal resistance and the Seebeck coefficient of the first thermoelectric means.

The first thermoelectric means may comprise a number of thermoelectric elements electrically connected in series and thermally connected in parallel and the second thermoelectric means may comprise a number of thermoelectric elements electrically connected in series and thermally connected in parallel.

The first thermoelectric means and the second thermoelectric means may be electrically connected in series via an electrical connection ensuring at least some of the heat flux is conducted between the first thermoelectric means and the second thermoelectric means.

The first thermoelectric means may comprise at least one thermoelectric element deposited on a substrate and the second thermoelectric means may comprise at least one thermoelectric element deposited on the substrate.

The device may be able to evaluate or measure the nth derivative, where n>1, of the heat flux and may comprise two thermoelectric means of opposite types, each means consisting of two means able to evaluate or to measure the derivative of order n−1, the thermoelectric means all being electrically and thermally connected in series.

The first and second thermoelectric means may be placed in contact with each other so that the heat flux passes through two thermoelectric elements in succession, especially without passing through another medium intermediate between them.

The first and second thermoelectric means may extend parallel or substantially parallel to each other.

The first and second thermoelectric means may each comprise parallel or substantially parallel heat flux input and output sides, these sides all lying parallel or substantially parallel to one another.

The device may be intended to be arranged so that the heat flux is perpendicular or substantially perpendicular to the directions in which the first and second thermoelectric means extend.

The device may be intended to be arranged so that the heat flux is parallel or substantially parallel to the directions in which the first and second thermoelectric means extend.

According to the invention, the evaluating or measuring system comprises at least one first device as defined above, and one second device as defined above, the first and second measuring devices being electrically connected in series and thermally connected in parallel.

According to the invention, the method for measuring or evaluating a characteristic of a heat flux exchanged between a first medium and a second medium comprises the following steps:

providing a first thermoelectric means;
providing a second thermoelectric means;
thermally and electrically connecting the first and second means in series between the first medium and the second medium;
evaluating or measuring the electrical voltage across the terminals of the set of first and second means; and
deducing from the preceding evaluation or measurement a characteristic of the heat flux flowing through the first and second means between the first medium and the second medium.

BRIEF DESCRIPTION OF THE FIGURES

The appended drawings show, by way of example, various embodiments of a measurement device according to the invention.

FIG. 1 is a simplified diagram showing the operation of a known prior-art sensor for measuring a heat flux.

FIG. 2 is a simplified diagram showing the operation of a known prior-art sensor for measuring a more complex heat flux.

FIG. 3 is a simplified diagram of a first embodiment of a measuring device according to the invention and a set of graphs explaining the operation of this first embodiment.

FIG. 4 is a simplified diagram of a second embodiment of a measuring device according to the invention and a set of graphs explaining the operation of this second embodiment.

FIGS. 5 and 6 are simplified diagrams of a first variant of the first embodiment of the measuring device according to the invention.

FIG. 10 shows a simplified diagram of a second variant of the second embodiment of the measuring device according to the invention.

FIG. 11 shows simplified diagrams of other variants of the second embodiment of the measuring device according to the invention.

FIG. 12 shows another variant of the first embodiment of a measuring device according to the invention.

FIG. 13 shows another variant of the second embodiment of a measuring device according to the invention.

FIG. 14 shows a first variant of a third embodiment of the measuring device according to the invention.

FIG. 15 shows a second variant of the third embodiment of the measuring device according to the invention.

DETAILED DESCRIPTION

Figure 7:
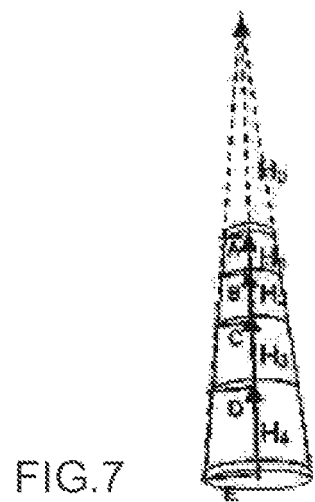
FIGS. 7 to 9 show various simplified diagrams of a first family of variants of the second embodiment of the measuring device according to the invention.

According to the invention, a device for measuring or evaluating, especially in real-time, a characteristic of a heat flux exchanged between a first medium and a second medium comprises a first thermoelectric means and a second thermoelectric means, the first and second thermoelectric means being electrically connected in series and thermally connected in series, the first thermoelectric means and the second thermoelectric means polarizing with opposite polarities under the effect of a heat flux having a given direction and a given sign.

The first thermoelectric means is of a first nature and the second thermoelectric means is of a second nature so that the first thermoelectric means and the second thermoelectric means polarize electrically with opposite polarities under the effect of a heat flux having a given direction and a given sign.

Such a measuring device is therefore obtained by associating, in series, in a specific way, thermoelectric means of different types, especially p-type (or p-doped) and n-type (or n-doped) thermoelectric means.

As will be seen below, the device may be generalized and may allow a heat flux, its time derivative and/or its second time derivative and/or its nth time derivative to be measured in real-time.

The principle of the device and therefore the principle of the measurement of real-time variations in the flux is based on the subtraction of two temporally staggered electrical signals.

Specifically, the discrete time derivative of a physical signal may be calculated as:

$$F'(t)=dF(t)/dt=\Delta F/\Delta t=[F(t_1)-F(t_0)]/(t_1-t_0);$$

and discrete nth derivatives may be calculated as:

$$F''(t)=d^2F(t)/dt^2=[F'(t_1)-F'(t_0)]/(t_1-t_0);$$

$$F'''(t)=d^3F(t)/dt^3=[F''(t_1)-F''(t_0)]/(t_1-t_0); \text{ and}$$

$$F^{n+1}(t)=d^nF(t)/dt^n=[F^n(t_1)-F^n(t_0)]/(t_1-t_0).$$

If two thermoelectric means of different natures (n-type and p-type) are thermally and electrically connected in series, then a signal equal to the addition of two opposed temporally staggered electrical signals is obtained. It will be noted that such a structure would be of no use for measuring heat flux itself because the addition of two opposed signals results in a null signal in equilibrium (or in the steady state) thereby preventing the flux from being measured.

Next, to measure the second derivative of the flux, it is necessary to electrically and thermally connect in series two systems such as mentioned above, i.e. two flux derivative measuring means thermally and electrically connected in series, these derivative measuring means being polarized with opposite polarities, for example a p-n structure could be thermally and electrically connected in series with an n-p structure forming either a p-n-n-p structure or an n-p-p-n structure.

Likewise, to measure the nth derivative, it is necessary to electrically and thermally connect in series $2^n/2$ devices such as mentioned above, i.e. $2^n/2$ flux derivative measuring means thermally and electrically connected in series, these derivative measuring means being polarized with opposite polarities, for example an n-p-p-n-p-n-n-p structure could be used for the 3rd derivative and an n-p-p-n-p-n-n-p-p-n-n-p-n-p-p-n or p-n-n-p-n-p-p-n-n-p-p-n-p-n-n-p structure for the 4th derivative.

A first embodiment of a measuring device according to the invention is shown in FIG. 3. The measuring device 10 comprises a first thermoelectric means 11, such as, for example, a conductive p-type material, and a second thermoelectric means 12, such as, for example, a conductive n-type material. One side of the first thermoelectric means and one side of the second thermoelectric means make contact with each other, these sides lying perpendicular to the heat flux. The first thermoelectric means is furthermore thermally coupled to a first medium 111, and the second thermoelectric means is furthermore thermally coupled to a second medium 112. Since the temperature $T_2$ of the first medium 111 is above the temperature $T_0$ of the second medium 112, a heat flux ϕ flows from the first medium to the second medium through the measuring device. Since the first thermoelectric means and the second thermoelectric means are thermally connected in series, the heat flux first flows through the first thermoelectric means and then flows through the second thermoelectric means. A temperature $T_1$ between the temperatures $T_0$ and $T_2$ may be measured at the interface between the first and second thermoelectric means.

Likewise, the first and second thermoelectric means are electrically connected in series. Thus, an electrical voltage V1 is established between the side of the first thermoelectric means making contact with the first medium and the interface between the first and second thermoelectric means. Likewise, an electrical voltage V2 is established between the interface located between the first and second thermoelectric means and the side of the second thermoelectric means making contact with the second medium. Furthermore, an electrical voltage V such that V=V1+V2 is established between the side of the first thermoelectric means making contact with the first medium and the side of the second thermoelectric means making contact with the second medium. The voltages V1 and V2 have opposite signs due to the fact that the first and second thermoelectric means are of different types. The electrical voltage V is an image of the time derivative ϕ' of the heat flux ϕ flowing through the measuring device 10, for example the derivative ϕ' of the heat flux is proportional to the electrical voltage V. It is therefore possible to produce a simple device for measuring the time derivative of a heat flux.

The four graphs in FIG. 3 show the variations over time of various physical quantities for the first embodiment.

A first graph, graph (1), shows the variation in the heat flux ϕ to which the measuring device is subjected. The heat flux entering into the measuring device has a magnitude that varies as a rectangular pulse of magnitude φ. The heat flux enters via the first thermoelectric means and exits via the second thermoelectric means. The thermal time constant of the first thermoelectric means is equal to $\tau_p = Rth_p \times m_p \times Cp_p$, and the thermal time constant of the second thermoelectric means is equal to $\tau_n = Rth_n \times (m_p \times Cp_p + m_n \times Cp_n)$, where:

$\tau_p$ and $\tau_n$ are the thermal time constants of the first and second thermoelectric means;

$Rth_p$ and $Rth_n$ are the thermal resistances of the first and second thermoelectric means;

$m_p$ and $m_n$ are the masses of the first and second thermoelectric means; and $Cp_p$ and $Cp_n$ are the specific heat capacities of the first and second thermoelectric means.

Given that $m_p \times Cp_p < m_p \times Cp_p + m_n \times Cp_n$, the variations in the temperatures $T_1$ and $T_2$ are temporally staggered. This thermal behaviour results in a temporally staggered variation in the voltages across the terminals of the second thermoelectric means (V2) and across the terminals of the first thermoelectric means (V1). Adding the (temporally staggered and oppositely signed) electrical signals generated by the first and second thermoelectric means then provides an image of the derivative of the heat flux, in particular the image is proportional to the derivative of the heat flux. The electrical voltage V is given by the following relationship:

$$V = V1 + V2 = K \times (\phi(t_0 + \Delta t) - \phi(t_0)) \equiv d\phi/dt \text{ (where } K \text{ is a constant depending on the Seebeck coefficients of the first and second thermoelectric means).}$$

The variations in the electrical voltages are shown in graph (3). The variations in the temperatures $T_0$, $T_1$ and $T_2$ are shown in graph (2). The variations in the time derivative of the heat flux are shown in graph (4).

A second embodiment of a measuring device 20 according to the invention is shown in FIG. 4. The measuring device 20 comprises a first thermoelectric means 21, such as for example a conductive p-type material, a second thermoelectric means 22, such as for example a conductive n-type material, a third thermoelectric means 23, such as for example a semiconductor n-type material, and a fourth thermoelectric means 24, such as for example a semiconductor p-type material. One side of the first thermoelectric means and one side of the second thermoelectric means make contact with each other, one side of the second thermoelectric means and one side of the third thermoelectric means make contact with each other, one side of the third thermoelectric means and one side of the fourth thermoelectric means make contact with each other. The first thermoelectric means is furthermore thermally coupled to a first medium 111 and the fourth thermoelectric means is furthermore thermally coupled to a second medium 112. Since the temperature $T_4$ of the first medium 111 is above the temperature $T_0$ of the second medium 112, a heat flux φ flows from the first medium to the second medium through the measuring device. Since the first thermoelectric means, the second thermoelectric means, the third thermoelectric means and the fourth thermoelectric means are thermally connected in series, the heat flux first flows through the first thermoelectric means, then through the second thermoelectric means, then through the third thermoelectric means, and finally through the fourth thermoelectric means. A temperature $T_3$ may be measured at the interface between the first and second thermoelectric means, a temperature $T_2$ may be measured at the interface between the second and third thermoelectric means and a temperature $T_1$ may be measured at the interface between the third and fourth thermoelectric means; the temperatures being between the temperatures $T_0$ and $T_4$.

Likewise, the first, second, third and fourth thermoelectric means are electrically connected in series. Thus, an electrical voltage V1 is established between that side of the first thermoelectric means which makes contact with the first medium and the interface between the first and second thermoelectric means. An electrical voltage V2 is established between the interface between the first and second thermoelectric means and the interface between the second and third thermoelectric means. An electrical voltage V3 is established between the interface between the second and third thermoelectric means and the interface between the third and fourth thermoelectric means. Likewise, an electrical voltage V4 is established between the interface between the third and fourth thermoelectric means and that side of the fourth thermoelectric means which makes contact with the second medium. Furthermore, an electrical voltage V such that V=V1+V2+V3+V4 is established between that side of the first thermoelectric means which makes contact with the first medium and that side of the fourth thermoelectric means which makes contact with the second medium. The voltages V1 and V4, on the one hand, and V2 and V3, on the other hand, are of opposite signs because the first and fourth thermoelectric means and the second and third thermoelectric means are of different types. The electrical voltage V is an image of the second time derivative φ" of the heat flux φ flowing through the measuring device 20, for example the second derivative φ" is proportional to the electrical voltage V. It is therefore possible to produce a simple device for measuring the second time derivative of a heat flux.

The four graphs in FIG. 4 show the variations over time of various physical quantities for the second embodiment.

A first graph, graph (1), shows the variation in the heat flux φ to which the measuring device is subjected. The heat flux entering into the measuring device has a magnitude that varies as a rectangular pulse of magnitude φ. The heat flux enters via the first thermoelectric means and exits via the fourth thermoelectric means.

The variation in the electrical voltage V1+V2 is shown in graph (2). The variation in the electrical voltage V3+V4 is shown in graph (3). The variation in the electrical voltage V is shown in graph (4).

Connecting in series two opposite types of measuring devices according to the first embodiment allows a measuring device according to the second embodiment to be obtained. Such a second embodiment allows the heat flux, the time derivative of the heat flux and the second time derivative of the heat flux to be measured or evaluated in real-time.

It will be noted that a measuring device having a p-n-n-p or n-p-p-n structure may be replaced with a p-n-p or n-p-n structure in which the central thermoelectric means have the thermal and electrical properties of the two central thermoelectric elements electrically and thermally connected in series, especially if it is desired to measure the second derivative of the heat flux without necessarily measuring the first derivative of the heat flux.

In the various embodiments, the thermoelectric means may be of any nature. Preferably, they are made of conductive materials, especially conductive p-type materials and conductive n-type materials.

In the measuring device embodiments described above, connecting the n- and p-type thermoelectric means in series in a specifically defined configuration makes it possible to measure heat flux variations in real-time, but as the signals originating from the n- and p-type thermoelectric means subtract from each other, the output signal is drastically reduced. It is therefore preferable to design and employ specific geometries that greatly increase the temporal stagger between the flux-measuring electrical signals generated along the device when the flux varies, in order to increase the output electrical signal.

Moreover, apart from the temporal stagger between the electrical signals, using systems comprising a number (N) of devices for measuring the derivative of heat flux, electrically connected in series and thermally connected in parallel, allows a better sensitivity to be obtained. This is because the electrical signal produced, for a given variation in heat flux, then has a higher amplitude: $V_{system}=N \times V_{device}$.

Moreover, differing the heat capacity and thermal resistance of the thermoelectric means allows the temporal stagger in the variation in the signals generated along the heat transfer, and thus the sensitivity of the measuring structure to variations in heat flux, to be increased.

Generally, to obtain this temporal stagger it is necessary for the opposite types (1 and 2) of measuring devices to respect the equation:

$$M_2 c_{P2} \times R_{th2} \geq m_1 c_{P1} \times R_{th1}$$

when the flux passes from medium 1 to medium 2. Possible variables are therefore the parameters of mass (therefore volume), heat capacity and thermal resistance.

A first variant of the first embodiment makes use of this aspect. In this first variant, the measuring device, shown in FIG. 5, comprises a first thermoelectric means 31 of mass $m_n$ and specific heat capacity $Cp_n$, and a second thermoelectric means 32 of mass $m_p$ and specific heat capacity $Cp_p$, the first and second means being electrically and thermally connected in series. In this first variant, the heat capacity of the second thermoelectric means is higher than the heat capacity of the first thermoelectric means and the thermal resistances of the first and second thermoelectric means are equal or substantially equal. For example, the heat capacity of the second thermoelectric means is 10% higher than the heat capacity of the first thermoelectric means. Since this difference is the cause of the temporal stagger, it is chosen depending on the desired precision.

Thus here $m_p \cdot Cp_p > m_n \cdot Cp_n$, $Rth_n = Rth_p$ and $Cp_p = Cp_n = Cp$, $Rth_p$ being the thermal resistance of the second means and $Rth_n$ being the thermal resistance of the first means.

In this specific case, the time constant of the second thermoelectric means is staggered by a factor $(m_n + \Delta m) \cdot Cp$ relative to the time constant of the first thermoelectric means, instead of only being staggered by a factor $m_n \cdot Cp$ if $m_n = m_p$ in the more conventional case.

A second variant of the first embodiment makes use of this aspect. In this second variant, the measuring device, shown in FIG. 6, comprises a first thermoelectric means 41 of mass $m_n$ and specific heat capacity $Cp_n$, and a second thermoelectric means 42 of mass $m_p$ and specific heat capacity $Cp_p$, the first and second means being electrically and thermally connected in series. In this second variant, the heat capacity of the second thermoelectric means is higher than the heat capacity of the first thermoelectric means. For example, the heat capacity of the second thermoelectric means is 10% higher than the heat capacity of the first thermoelectric means. The thermal resistance of the second thermoelectric means is higher than the thermal resistance of the first thermoelectric means. For example, the thermal resistance of the second thermoelectric means is 10% higher than the thermal resistance of the first thermoelectric means.

Thus here $m_p \cdot Cp_p > m_n \cdot Cp_n$, $Rth_p > Rth_n$ and $Cp_p = Cp_n = Cp$, $Rth_p$ being the thermal resistance of the second means and $Rth_n$ being the thermal resistance of the first means.

In this specific case, the time constant of the second thermoelectric means is staggered by a factor $(m_n + \Delta m) \cdot Cp \times (1 + \Delta Rth)$ relative to the time constant of the first thermoelectric means, instead of only being staggered by a factor $m_n \cdot Cp$ if $m_n = m_p$ in the more conventional case.

Therefore, to improve the sensitivity of measurement of the derivatives of heat flux, it is preferable for the heat capacities of the component thermoelectric means of a measuring device to be different (regularly increasing in the direction of the second, i.e. the colder, medium or in the direction of travel of the heat flux).

Alternatively or additionally, to improve the sensitivity of the measurement of the derivatives of the heat flux, it is preferable for the thermal resistances of the component thermoelectric means of a measuring device to be different (regularly increasing in the direction of the second, i.e. the colder, medium or in the direction of travel of the heat flux). Preferably, the product of the thermal resistance and the Seebeck coefficient remains constant.

Moreover, it is advantageous to use thermoelectric means (n and p, n-p and p-n, n-p-p-n and p-n-n-p, etc.) that generate equal electrical signals in equilibrium in order to obtain a null signal in equilibrium (corresponding to a derivative of zero), i.e. with N thermoelectric means: $V_1 = -V_2 = V_3 = -V_4 = V_N = \Delta T \times S = Rth_m \times \phi \times S_m$ in equilibrium (where $S_{np}$ is the Seebeck coefficient of the thermoelectric means and $Rth_m$ is the thermal resistance of each thermoelectric means). This condition is obtained for: $Rth_m \times S_m = $constant.

In the rest of the text the expression "device of the first type" will be understood to mean a device comprising thermoelectric means the heat capacities of which increase in the direction of the second medium and the thermal resistances of which are equal, and the expression "device of the second type" will be understood to mean a device comprising thermoelectric means the heat capacities of which increase in the direction of the second medium and the thermal resistances of which increase in the direction of the second medium, the product of thermal resistance and Seebeck coefficient remaining constant.

The main advantage of devices of the first type is the following: it is not necessary to use different processes during manufacture to obtain different Seebeck coefficients for the various thermoelectric means.

The main advantage of devices of the second type is the following: it is possible to produce devices that have a constant cross section in the direction of heat transfer.

Figure 8:
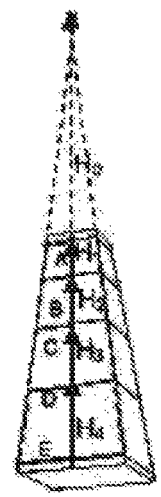
Figure 9:
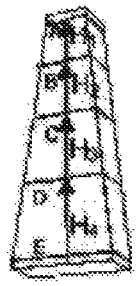

For measuring devices of the first type, a linear variation with no discontinuities (no steps between the elements) in the cross section along the measuring device and therefore in the heat transfer direction optimizes transfer of current and heat. FIGS. 7 to 9 show three possible geometries for producing measuring devices of the first type.

For measuring devices of the second device, it is advantageous for the cross section of the device to remain constant in order to make manufacture, especially of the thermoelectric means, easier. FIG. 10 shows a possible geometry for producing measuring devices of the second type.

As shown in FIG. 11, other measuring device geometries may be envisaged, especially:
 a geometry in which the product of thermal resistance and Seebeck coefficient remains constant and in which the cross section of the device varies in the direction of travel of the heat transfer; and a geometry in which the thermal resistance of successive thermoelectric means remains constant, in which the Seebeck coefficients of the various thermoelectric means are equal, and in which the cross section of the device varies continuously, but not linearly, along the direction of travel of heat transfer.

Generally, it is possible to use any type of thermoelectric material to produce a device for measuring the derivative of heat flux according to the invention. However, materials having a high Seebeck coefficient and above all a high figure of merit ZT (in the envisaged temperature range) will preferably be used. For example $Bi_2Te_3$ may be used for an average temperature of about 100° C., SiGe for an average temperature of about 600° C., and $Mg_2SiSn$ and $Zn_4Sb_3$ for an average temperature of about 300-400° C. The figure of merit ZT is a dimensionless number that characterizes the overall thermoelectric performance of a material: $ZT=S^2 \cdot (\sigma/\lambda)$, where S is the Seebeck coefficient, $\sigma$ the electrical conductivity and $\lambda$ the thermal conductivity of the material. Moreover, the use of nanostructured thermoelectric materials is recommended because in these materials interfaces between nano-aggregates promote phonon scattering, thereby considerably reducing their thermal conductivity while simultaneously improving their thermoelectric performance and the sensitivity of devices measuring heat flux and heat flux variations.

The measuring device may be a system comprising a number of measuring devices according to the first embodiment or according to the second embodiment, these measuring devices being thermally connected in parallel and electrically connected in series. Such a system allows the electrical responses of each measuring device to be added and guarantees a better measurement sensitivity. A measuring system comprising N measuring devices is N times more sensitive than a single measuring device.

Another variant of the first embodiment of a measuring device 50 or measuring system according to the invention is shown in FIG. 12. The measuring system 50 comprises various measuring devices 51, 52, 53, 54, 55 and 56 that are electrically connected in series and thermally connected in parallel. Each measuring device only comprises two thermoelectric means and allows a signal representative of the derivative of the heat flux to be produced.

Another variant of the second embodiment of a measuring device 60 or measuring system according to the invention is shown in FIG. 13. The measuring system 60 comprises various measuring devices 61, 62, 63, 64, 65 and 66 that are electrically connected in series and thermally connected in parallel. Each measuring device comprises four thermoelectric means and allows a signal representative of the second derivative of the heat flux to be produced.

In the two variants shown in FIGS. 12 and 13, the devices 51-56 and 61-66 have opposite types of structure: the device 51 has a p-n structure, the following device 52 an n-p structure, the following device 53 a p-n structure, and so on; likewise, the device 61 has an n-p-p-n structure, the following device 62 a p-n-n-p structure, the following device 63 an n-p-p-n structure, and so on.

In a third embodiment, the measuring device is a system comprising a number of known prior-art measuring devices, these measuring devices being thermally connected in parallel and electrically connected in series. Such a system allows the electrical responses of each measuring device to be added.

A first variant of the third embodiment of a measuring device 70 or measuring system according to the invention is shown in FIG. 14. The measuring system 70 comprises various measuring devices 71, 72, 73 and 74 that are electrically connected in series and thermally connected in parallel. Each measuring device is a measuring device such as shown in FIG. 2. Each of these measuring devices is of a first nature or of a second nature and polarizes with a first polarity or with a second polarity (opposite to the first polarity) under the effect of a given heat flux. The devices 71 and 74 are of a first nature and the devices 72 and 73 are of a second nature. Thus, across the terminals of the devices 73 and 74 or of the devices 72 and 71, voltages are established that are images of the derivative of the heat flux and, across the terminals of the set of devices 71 to 74, a voltage is established that is the image of the second derivative of the heat flux. Furthermore, across the terminals of each of the devices 71 to 74, a voltage is established that is either an image of the heat flux or a negative of the image of the heat flux.

A second variant of the third embodiment of a measuring device 80 or measuring system according to the invention is shown in FIG. 15. The measuring system 80 comprises various measuring devices 81, 82, 83 and 84 electrically connected in series and thermally connected in parallel. It differs from the first variant of the fourth embodiment in that electrical connections 85 between the various measuring devices allow some of the heat flux to be transferred. These electrical connections connect various thermoelectric means of successive measuring devices.

This specific configuration has the advantage of allowing heat flux and its derivative and its second derivative to be measured simultaneously using the electrical connections between the various devices 71, 72, 73, 74 or 81, 82, 83, 84.

The choice of the thickness and volume of the thermoelectric means allows devices for measuring heat flux having various temporal resolutions to be designed. The use of bulk elements 500 μm to a few millimeters in thickness allows devices for measuring heat flux variation to be produced with quite large temporal resolutions, of the order of a millisecond to of the order of a second. Using microscopic elements (100 μm to 500 μm), especially produced by virtue of printing technologies (inkjet printing, screen printing, etc.), allows devices for measuring variation in heat flux having temporal resolutions of a number of μs to a few ms to be produced.

Finally, the use of microscopic elements (100 nm to 100 μm), especially produced by virtue of the thin-film deposition technologies (PVD, CVD, etc.) used in the microelectronics field, allows low-heat-capacity devices for measuring variation in heat flux having extremely small temporal resolutions, of the order of a picosecond to a microsecond, to be produced.

It will be noted that the use of printing technologies allows large measuring devices comprising many elements to be designed and produced inexpensively.

In other variants of the third embodiment, thin layers deposited on a conductive substrate (for example Si, $Al_2O_3$, AlN, etc.) are used as thermoelectric means. It is interesting to note that the heat flux passes almost exclusively through the substrate, the thermoelectric means merely taking the same temperature as the substrate on which they are deposited. In this case, to design optimized measuring devices such as described above, the thermal resistance and the heat capacity to be taken into account when choosing the geometry are essentially those of the substrate present under the thermoelectric means.

Figure 16:
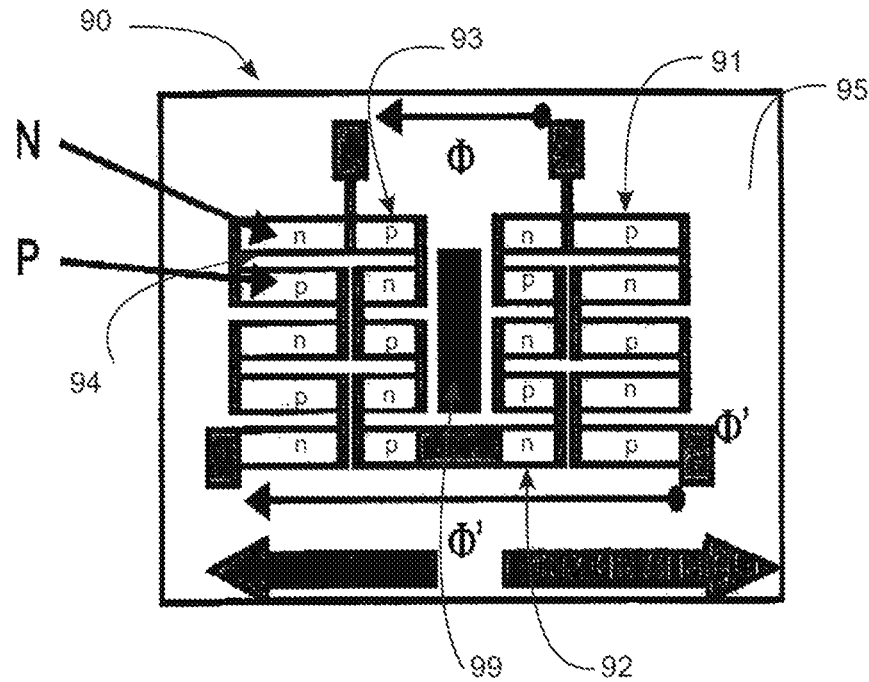
FIG. 16 shows a third variant of the third embodiment of the measuring device according to the invention.

A third variant of the third embodiment of a measuring device 90 according to the invention is shown in FIG. 16. The measuring system 90 comprises various measuring devices 91, 92, 93 and 94 electrically connected in series and thermally connected in series. Each measuring device comprises a measuring device such as shown in FIG. 2, the difference being that the thermoelectric means are layers deposited on a substrate 95. The device allows derivatives of the heat flux flowing through the substrate from a first hot medium 99 to be measured.

Figure 17:
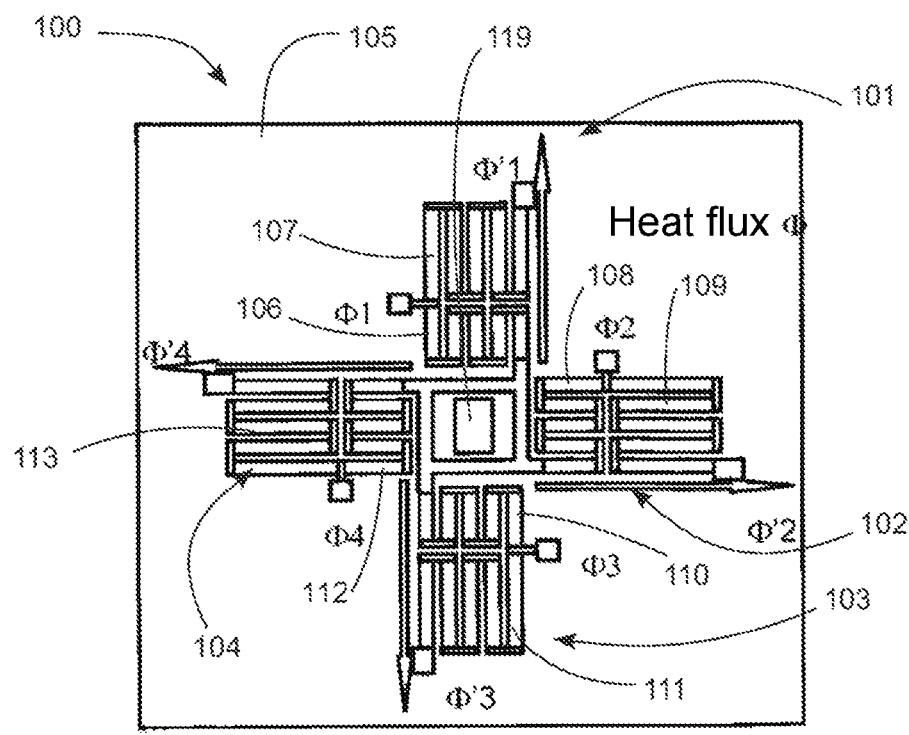
FIG. 17 shows a fourth variant of the third embodiment of the measuring device according to the invention.

A fourth variant of the third embodiment of a measuring device 100 according to the invention is shown in FIG. 17. The measuring system 100 comprises various modules 101, 102, 103, 104 placed radially on a substrate 105. Each module comprises two measuring devices 106, 107; 108, 109; 110, 111; 112, 113 electrically connected in series and thermally connected in series. Each measuring device comprises a measuring device such as shown in FIG. 2, the difference being that the thermoelectric means are layers deposited on the substrate 105. The device allows derivatives of the heat flux flowing through the substrate from a first hot medium 119, in the four substrate directions, to be measured.

Figure 18:
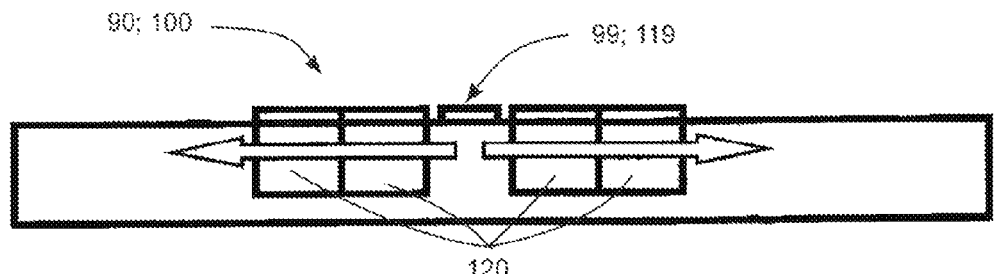
FIG. 18 shows a fifth variant of the third embodiment of the measuring device according to the invention.

As shown in FIG. 18, in order to optimize the third or fourth variant of the third embodiment, provision may be made to shape the substrate in order to incorporate into said substrate, under the thermoelectric means, elements 120 of different heat capacities.

Figure 19:
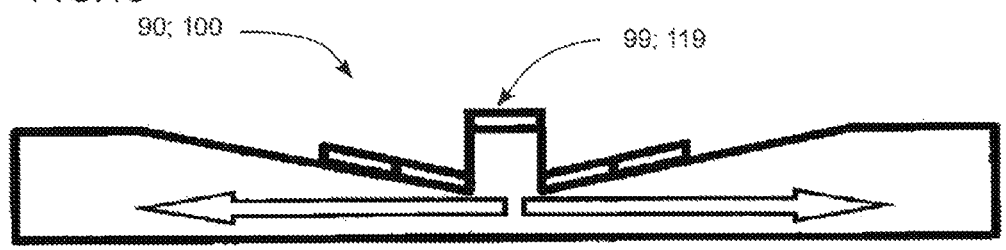
FIG. 19 shows a sixth variant of the third embodiment of the measuring device according to the invention.

Alternatively or additionally, as shown in FIG. 19, in order to optimize the third or fourth variant of the third embodiment, provision may be made to shape the substrate, for example by micromachining, so that the heat capacity and/or the thermal resistance of the substrate changes in the heat flux direction.

Of course, these measuring devices may be extrapolated to allow the nth ($n^{th}$) derivative of the heat flux to be measured.

Figure 20:
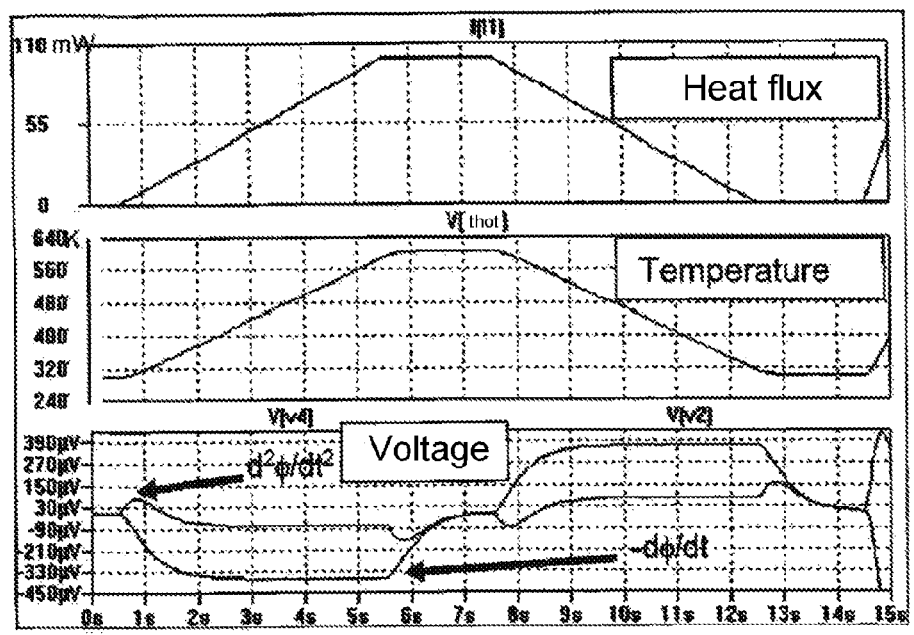
FIGS. 20 to 22 show graphs of simulations of the operation of measuring devices according to the invention.
Figure 21:
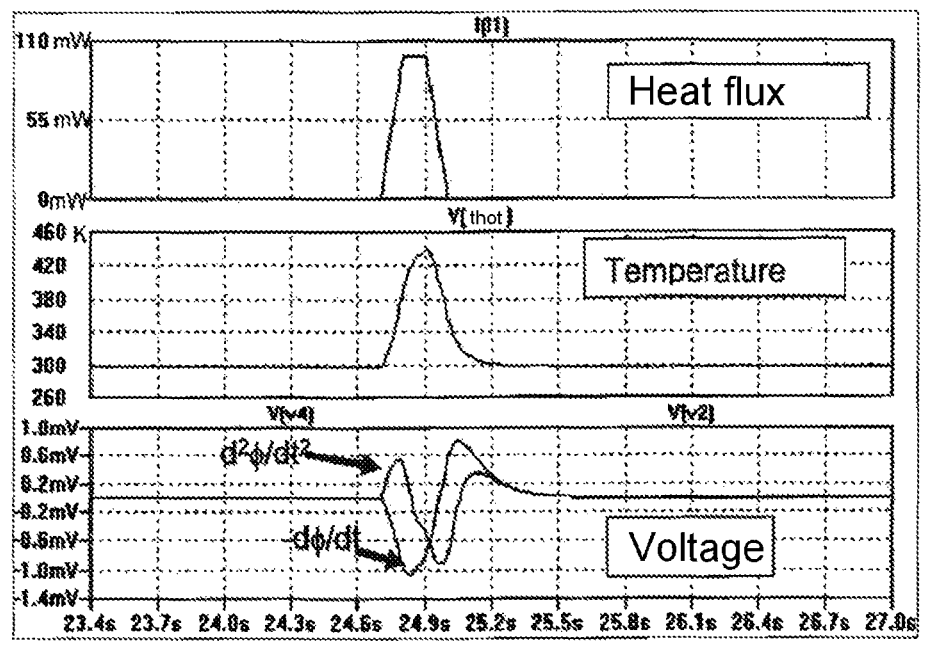
Figure 22:
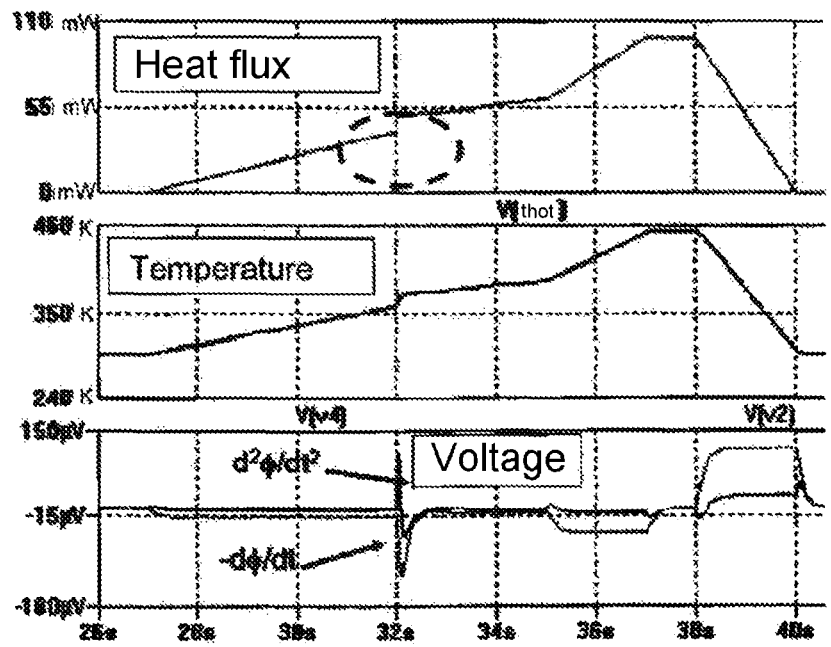

The graphs in FIGS. 20 to 22, obtained by numerical simulation, clearly show that the devices according to the invention allow the first and higher order derivatives of a heat flux to be measured in real-time.

The graphs in FIG. 20 show the behaviour of a 1 mm by 1 mm by 1 mm measuring device made of $Bi_2Te_3$ following a slow thermal excitation of 100 mW.

By correctly choosing the dimensions of the measuring device, it is possible to increase the temporal resolution and distinguish brief thermal signals and even discrete or even quasi-discrete thermal effects.

For example, the graphs in FIG. 21 show the behaviour of a measuring device made of thin $Bi_2Te_3$ layers following a rapid thermal excitation of 110 mW.

Again for example, the graphs in FIG. 22 show the behaviour of a thin $Bi_2Te_3$ layer measuring device during a discrete thermal event at t=32 s.

These few simulations show that the measuring device according to the invention allows heat flux variations to be measured in real-time and discrete thermal events to be observed.

The measuring device according to the invention is suitable for the following applications:
  temperature regulation, the derivative of the heat flux allowing temperature variation (dT/dt=variation gradient in T° C.) to be predicted;
  detection of physical events, the derivative and second derivative of heat flux and temperature allowing abrupt temperature changes caused by a physicochemical event (initiation of crystal growth, etc.) to be detected, detection of the outbreak of fire;
  medical imaging, the conversion of X-rays in scintillators produces heat. A measuring device according to the invention makes it possible to prevent thermal failure related to this production of heat; and
  multi-pixel sensors for sensing temperature variations, allowing maps of temperature variations that can be used in video surveillance to be produced, especially for the purpose of detecting a change in behaviour.

The invention also relates to a method for measuring or evaluating a characteristic of a heat flux exchanged between a first medium and a second medium. The method comprises the following steps:
  providing a first thermoelectric means;
  providing a second thermoelectric means;
  thermally and electrically connecting the first and second means in series between the first medium and the second medium;
  evaluating or measuring the electrical voltage across the terminals of the set of first and second means; and
  deducing from the preceding evaluation or measurement a characteristic of the heat flux flowing through the first and second means between the first medium and the second medium Throughout this document, the expression "thermoelectric means" is preferably understood not to cover the notion of "thermocouple". Even more preferably, the expression "thermoelectric means" is understood to cover a solid made of one and the same thermoelectric material, and even an arrangement of a number of solids made of different materials thermally connected in parallel or in series and electrically connected in parallel or in series.

The invention claimed is:

1. A device for measuring or evaluating a characteristic of a heat flux exchanged between a first medium and a second medium, the device comprising
  a first thermoelectric element and
  a second thermoelectric element,
  the first and second thermoelectric elements being electrically connected in series and thermally connected in series, the first thermoelectric element being of a first type and the second thermoelectric element being of a second type different from the first type,
  the first and second types being such that the first thermoelectric element and the second thermoelectric element polarize with opposite polarities under the effect of the heat flux having a given direction and a given sign.

2. The device according to claim 1, wherein a product of a heat capacity of the second thermoelectric element and a thermal resistance of the second thermoelectric element is greater than a product of a heat capacity of the first thermoelectric element and a thermal resistance of the first thermoelectric element.

3. The device according to claim 1, wherein a product of the thermal resistance and a Seebeck coefficient of the second thermoelectric element is substantially equal to a product of the thermal resistance and a Seebeck coefficient of the first thermoelectric element.

4. The device according to claim 1, wherein the first thermoelectric element comprises at least one thermoelectric element deposited on a substrate and in that the second thermoelectric element comprises at least one thermoelectric element deposited on the substrate.

5. The device according to claim 1, wherein the device is enabled to evaluate or measure an nth derivative, where n>1, of the heat flux and comprises $2^{n-1}$ pairs of first and second thermoelectric elements of opposite types to evaluate or to measure the derivative of order n−1, the thermoelectric elements all being electrically and thermally connected in series.

6. The device according to claim 1, wherein the first and second thermoelectric elements are placed in contact with each other so that the heat flux passes through the two thermoelectric elements in succession, without passing through another medium intermediate between them.

7. The device according to claim 1, wherein the first and second thermoelectric elements extend parallel or substantially parallel to each other.

8. The device according to claim 1, wherein the first and second thermoelectric elements each comprise parallel or substantially parallel heat flux input and output sides, these sides all lying parallel or substantially parallel to one another.

9. The device according to claim 1, wherein the device is arranged so that the heat flux is perpendicular or substantially perpendicular to a direction in which the first and second thermoelectric elements extend.

10. The device according to claim 1, wherein the device is arranged so that the heat flux is parallel or substantially parallel to a direction in which the first and second thermoelectric elements extend.

11. The device according to claim 1, wherein the first thermoelectric element comprises a plurality of thermoelectric elements electrically connected in series and thermally connected in parallel and wherein the second thermoelectric element comprises a plurality of thermoelectric elements electrically connected in series and thermally connected in parallel.

12. The device according to claim 11, wherein the first thermoelectric element and the second thermoelectric element are electrically connected in series via an electrical connection so that at least some of the heat flux is conducted between the first thermoelectric element and the second thermoelectric element.

13. The device according to claim 1, wherein a cross-sectional area of the device perpendicular to the heat flux is constant.

14. The device according to claim 13, wherein a thermal resistance of the second thermoelectric element is greater than or substantially equal to a thermal resistance of the first thermoelectric element.

15. The device according to claim 14, wherein a height of the second thermoelectric element is greater than a height of the first thermoelectric element and wherein the thermal resistance of the second thermoelectric element is at least substantially equal to the thermal resistance of the first thermoelectric element.

16. The device according to claim 1, wherein a cross-sectional area of the device perpendicular to the heat flux is not constant.

17. The device according to claim 16, wherein a cross-sectional area of the second thermoelectric element perpendicular to the heat flux is larger than a cross-sectional area of the first thermoelectric element perpendicular to the heat flux.

18. The device according to claim 17, wherein the cross-sectional area of the second thermoelectric element perpendicular to the heat flux is continuously variable.

19. The device according to claim 18, wherein a thermal resistance of the second thermoelectric element is greater than or equal to a thermal resistance of the first thermoelectric element.

20. The device according to claim 1, wherein a characteristic of the heat flux includes a time derivative of the heat flux.

21. An evaluating or measuring system comprising at least one first device according to claim 1, and one second device according to claim 1, wherein the first and second measuring devices are electrically connected in series and thermally connected in parallel.

* * * * *